US012690180B1

(12) United States Patent
DeVries

(10) Patent No.: US 12,690,180 B1
(45) Date of Patent: Jul. 21, 2026

(54) WINDOW POCKET ACCOMMODATING PASS-THROUGH PLATE ON ELECTROMAGNETICALLY SHIELDED ENCLOSURE

(71) Applicant: Faraday Defense Corporation, Kalamazoo, MI (US)

(72) Inventor: Jason R DeVries, Kalamazoo, MI (US)

(73) Assignee: Faraday Defense Corporation

( * ) Notice: Subject to any disclaimer, the term of this patent is extended or adjusted under 35 U.S.C. 154(b) by 78 days.

(21) Appl. No.: 18/936,926

(22) Filed: Nov. 4, 2024

(51) Int. Cl.
H05K 9/00 (2006.01)

(52) U.S. Cl.
CPC ......... H05K 9/0009 (2013.01); H05K 9/0043 (2013.01)

(58) Field of Classification Search
CPC .................................................... H05K 9/0043
See application file for complete search history.

(56) References Cited

U.S. PATENT DOCUMENTS

| | | | | |
|---|---|---|---|---|
| 8,530,756 | B1 | 9/2013 | Winch | |
| 8,723,053 | B2 | 5/2014 | Winch | |
| 9,029,714 | B2 | 5/2015 | Winch | |
| 9,930,816 | B2 | 3/2018 | Winch | |
| 2008/0212303 | A1* | 9/2008 | Farnworth | ....... G06K 19/07327 |
| | | | | 361/816 |
| 2012/0285737 | A1* | 11/2012 | Judy | .................... H05K 9/0043 |
| | | | | 174/382 |

| | | | | |
|---|---|---|---|---|
| 2013/0206470 | A1* | 8/2013 | Davis | ..................... H01R 13/72 |
| | | | | 439/502 |
| 2013/0277101 | A1* | 10/2013 | Judy | .................... H05K 9/0043 |
| | | | | 174/378 |
| 2015/0289421 | A1* | 10/2015 | Ho | ......................... G06F 1/1656 |
| | | | | 361/679.02 |
| 2023/0209787 | A1* | 6/2023 | Parry | ................... H05K 9/0007 |
| | | | | 361/816 |
| 2023/0318653 | A1* | 10/2023 | Khalifeh | .................. C08J 5/244 |
| | | | | 455/575.1 |

OTHER PUBLICATIONS

EMI RFI RF Shielded Honeycomb Air Vents https://www.ramayes.com/RF_Shielded_Honeycomb_Air_Vents.htm accessed Oct. 3, 2024.

(Continued)

*Primary Examiner* — Hung V Ngo
(74) *Attorney, Agent, or Firm* — Patents and Licensing LLC; Daniel W. Juffernbruch

(57) ABSTRACT

A window in an electromagnetic shielded fabric side wall has a pocket. The electromagnetic shielded fabric side wall is in an electromagnetic shielded enclosure with a floor. An opening has an inner perimeter and an outer perimeter. An inner perimeter and an outer perimeter of the opening in the side wall each has electromagnetic shielded fabric lined with at least one outer row of magnets. A conductive ferrous pass-through plate fits in the opening between the inner rows of magnets and the outer rows of magnets and is magnetically attracted to the inner rows of magnets and the outer rows of magnets. The opening is adjacent to the floor at a bottom of the electromagnetic shielded enclosure. The inner row and the outer row of magnets can be one or two or more rows aligned or staggered. A fold-over top flap is lined with a top row of magnets.

14 Claims, 8 Drawing Sheets

(56) References Cited

OTHER PUBLICATIONS

RA Mayes OnFILTER Inline EMI Filters for AC, DC and Ground https://www.ramayes.com/OnFILTER_EMI_Filters.htm accessed Oct. 3, 2024.
Ramsey EMI RF Shielded Ethernet, USB, HDMI Filters https://www.ramayes.com/RF_Shielded_Room_Ethernet_Filter.htm accessed Oct. 3, 2024.

* cited by examiner

Section I-I

Section I-I

4003

4070

4071

4060

4050

4061

4051

4002

4040

4051

4050

4061

4060

Section I-I

Section I-I

Section I-I

4003

4070

4071

4060

4050

4002

4040

4050

4060

Section I-I

4003

4070

4071

4050

4060

4002

4040

4050

4050

4060

Section I-I

WINDOW POCKET ACCOMMODATING PASS-THROUGH PLATE ON ELECTROMAGNETICALLY SHIELDED ENCLOSURE

BACKGROUND OF THE INVENTIONS

1. Technical Field

The present inventions relate to electromagnetic shielding fabric enclosures and, more particularly, relate to openings for electromagnetic shielding fabric enclosures.

2. Description of the Related Art

Electromagnetically shielded rooms and enclosures are known. Rigid doors for such rooms are known with copper spring seals and metal flanges.

Soft fabric enclosures and tents are flexible, lightweight, and easily stored, shipped, and deployed.

What is needed is an effective electromagnetically shielded opening for electromagnetic shielded fabric enclosures.

BRIEF DESCRIPTION OF THE DRAWINGS

The present inventions are illustrated by way of example and are not limited by the accompanying figures, in which like references indicate similar elements. Elements in the figures are illustrated for simplicity and clarity and have not necessarily been drawn to scale.

The details of the preferred embodiments will be more readily understood from the following detailed description when read in conjunction with the accompanying drawings wherein:

FIG. 1 illustrates a perspective view of a conductive ferrous pass-through plate according to embodiments of the present inventions;

FIG. 2 illustrates a side view of the conductive ferrous pass-through plate of FIG. 1 according to embodiments of the present inventions;

FIG. 3 illustrates a perspective view of a window pocket in an electromagnetic shielded fabric side wall according to embodiments of the present inventions;

FIG. 4 illustrates cross-section side view of the window pocket of FIG. 3 according to embodiments of the present inventions;

DETAILED DESCRIPTION OF THE PREFERRED EMBODIMENTS

Figures 1, 2, 3, 4:
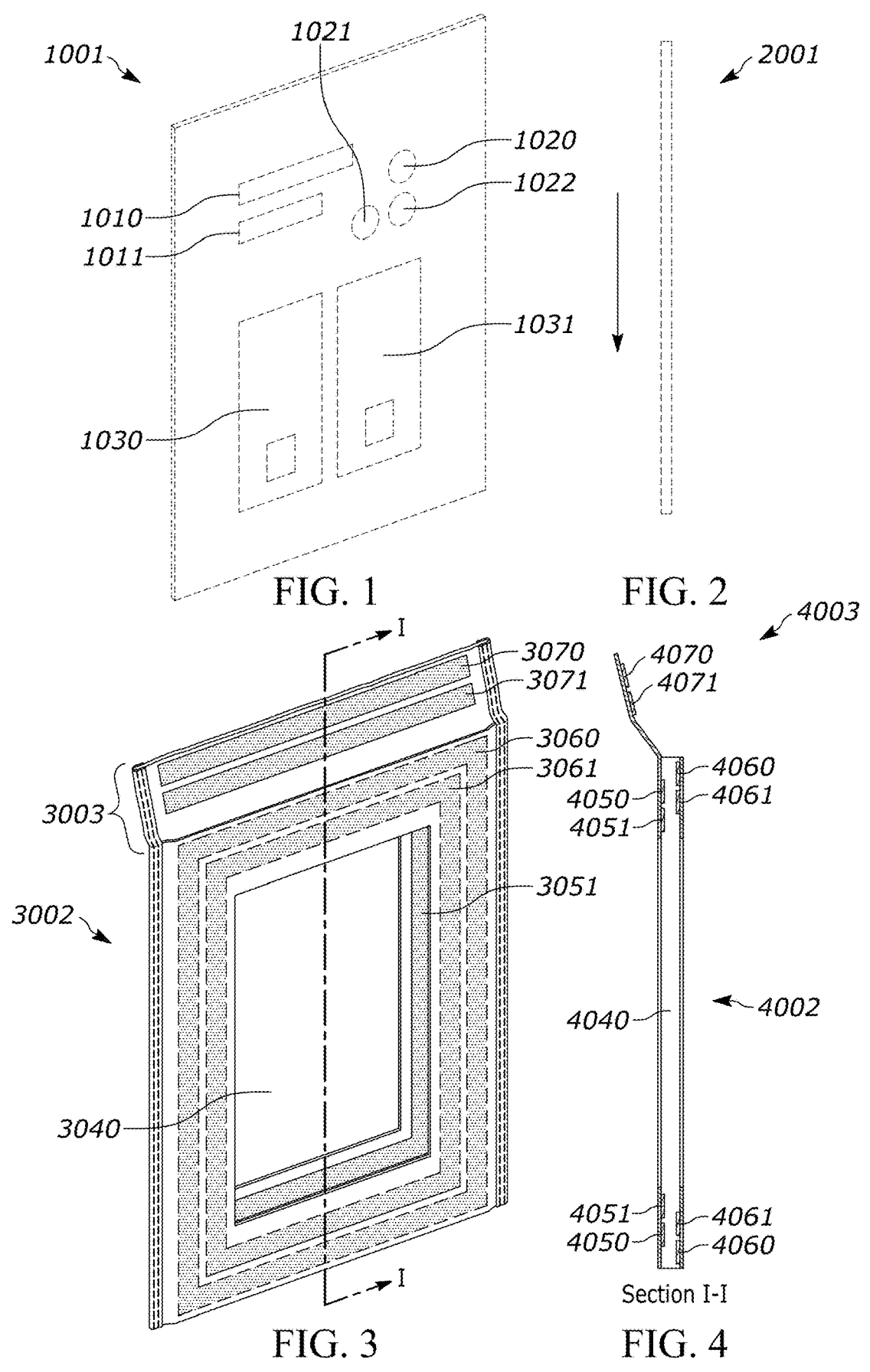

FIG. 1 illustrates a perspective view of a conductive ferrous pass-through plate 1001 according to embodiments of the present inventions. Pass-through plate 1001 has a conductive ferrous material magnetically attracted to the inner rows of magnets and the outer rows of magnets. The pass-through plate has pass-through horizontal rectangle 1010, 1011, circular 1020, 1021, 1022, and vertical rectangle 1030, 1031 shaped orifices used for example to accommodate electromagnetically shielded electrical or optical cables or electromagnetically shielded air vents. Horizontal rectangle orifices can be useful for flat cables. Circular orifices can be useful for coaxial cables. Vertical rectangles can be useful for outlet attachment.

FIG. 2 illustrates a side view of the conductive ferrous pass-through plate 2001 of FIG. 1 according to embodiments of the present inventions.

FIG. 3 illustrates a perspective view of a window pocket 3002 in an electromagnetic shielded fabric side wall according to embodiments of the present inventions. The window pocket in an electromagnetic shielded enclosure has an electromagnetic shielded enclosure with one electromagnetic shielded fabric side wall and a floor. An opening 3040 in the electromagnetic shielded fabric side wall, has an inner perimeter lined with two inner rows of magnets 3050, 3051 around the opening. An outer perimeter of the opening 3040 in the electromagnetic shielded fabric side wall has an electromagnetic shielded fabric lined with two outer row of magnets 3060, 3061 around the opening.

A fold-over top flap 3003 at a perimeter of the opening 3040 seals the pass-through plate in the opening. The fold-over top flap is lined with two top rows of magnets 3070 and 3071.

A pass-through plate will fit in the opening 3040 between inner rows of magnets 3050 and 3051 and outer rows of magnets 3060 and 3061. The pass-through plate is made of a conductive ferrous material such as streel that is magnetically attracted to the inner rows of magnets and the outer rows of magnets.

FIG. 4 illustrates cross-section side view of the window pocket of FIG. 3 according to embodiments of the present inventions. All of the inner rows of magnets 4050, 4051 are staggered with respect to all of the outer rows of magnets 4060, 4061, each staggering a distance equal to about $\frac{2}{3}^{rd}$ the width of the magnet row. Outer row magnet 4060 is staggered with inner row magnet 4050. Inner row magnet 4050 is staggered with outer row magnet 4061. Outer row magnet 4061 is staggered with inner row magnet 4051.

A fold-over top flap 4003 at a perimeter of the opening 4040 seals the pass-through plate in the opening. The fold-over top flap is lined with two top rows of magnets 4070, 4071.

Figures 5, 6:
FIG. 5 illustrates cross-section side view of the window pocket of FIG. 3 according to embodiments of the present inventions.
FIG. 6 illustrates cross-section side view of the window pocket of FIG. 3 according to embodiments of the present inventions.

FIG. 5 illustrates cross-section side view of the window pocket 4002 of FIG. 3 according to embodiments of the present inventions. Inner row magnet 4050 is aligned with outer row magnet 4061. Outer row magnet 4060 is staggered, at distance equal to about the width of 1.25 a magnet row, with inner row magnet 4050. Outer row magnet 4061 is staggered, at a distance equal to about the width of 1.25 magnet row, with inner row magnet 4051.

A fold-over top flap 4003 at a perimeter of the opening 4040 seals the pass-through plate in the opening. The fold-over top flap is lined with two top rows of magnets 4070, 4071.

FIG. 6 illustrates cross-section side view of the window pocket of FIG. 3 according to embodiments of the present inventions. All of the inner rows of magnets 4050, 4051 are staggered with respect to all of the outer rows of magnets 4060, 4061, each staggering the width of one magnet row apart. Outer row magnet 4060 is staggered with inner row magnet 4050. Inner row magnet 4050 is staggered with outer row magnet 4061. Outer row magnet 4061 is staggered with inner row magnet 4051.

A fold-over top flap 4003 at a perimeter of the opening 4040 seals the pass-through plate in the opening 4040. The fold-over top flap is lined with two top rows of magnets 4070, 4071.

Figures 7, 8:
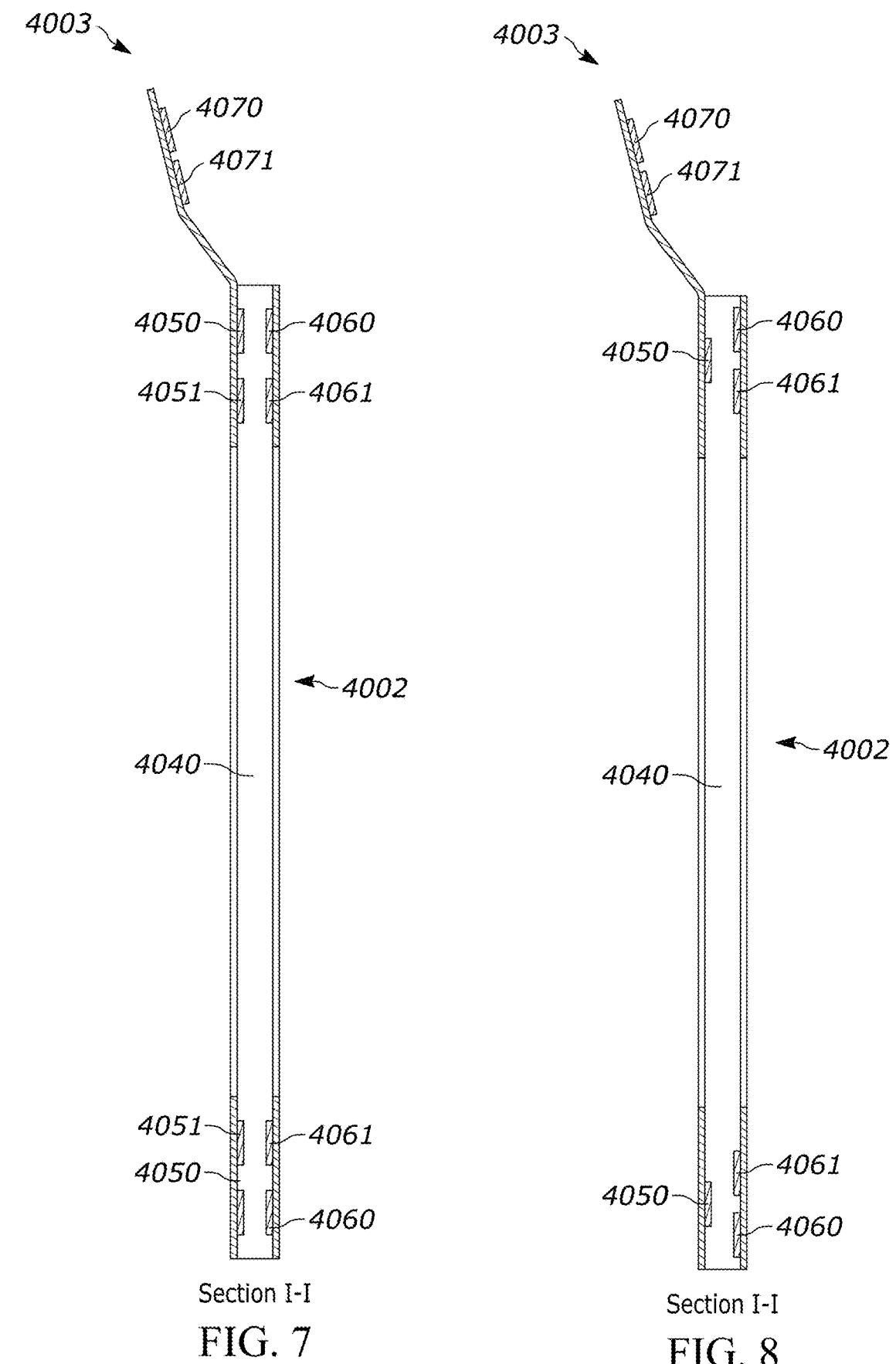
FIG. 7 illustrates cross-section side view of the window pocket of FIG. 3 according to embodiments of the present inventions.
FIG. 8 illustrates cross-section side view of the window pocket of FIG. 3 according to embodiments of the present inventions.

FIG. 7 illustrates cross-section side view of the window pocket 4002 of FIG. 3 according to embodiments of the present inventions. All of the inner rows of magnets 4050, 4051 are aligned with respect to all of the outer rows of magnets 4060, 4061. Outer row magnet 4060 aligned with inner row magnet 4050. Outer row magnet 4061 aligned with inner row magnet 4051.

A fold-over top flap 4003 at a perimeter of the opening 4040 seals the pass-through plate in the opening. The fold-over top flap is lined with two top rows of magnets 4070, 4071.

FIG. 8 illustrates cross-section side view of the window pocket of FIG. 3 according to embodiments of the present inventions. The inner row of magnets 4050 is staggered with respect to both outer rows of magnets 4060, 4061. Outer row magnet 4060 is staggered, at distance equal to about $\frac{2}{3}^{rd}$ the width of magnet row, with inner row magnet 4050. Inner row magnet 4050 is staggered, at a distance equal to about $\frac{2}{3}^{rd}$ the width of the magnet row, with outer row magnet 4061.

A fold-over top flap 4003 at a perimeter of the opening 4040 seals the pass-through plate in the opening. The fold-over top flap is lined with two top rows of magnets 4070, 4071.

Figures 9, 10:
FIG. 9 illustrates cross-section side view of the window pocket of FIG. 3 according to embodiments of the present inventions.
FIG. 10 illustrates cross-section side view of the window pocket of FIG. 3 according to embodiments of the present inventions.

FIG. 9 illustrates cross-section side view of the window pocket 4002 of FIG. 3 according to embodiments of the present inventions. The outer row magnet 4060 is staggered with respect to the inner row magnets 4050 at a distance equal to about one and a half of the width of magnet row.

A fold-over top flap 4003 at a perimeter of the opening 4040 seals the pass-through plate in the opening. The fold-over top flap is lined with two top rows of magnets 4070, 4071.

FIG. 10 illustrates cross-section side view of the window pocket 4002 of FIG. 3 according to embodiments of the present inventions. The outer row magnet 4060 is aligned a same elevation with respect to the inner row magnets 4050.

A fold-over top flap 4003 at a perimeter of the opening 4040 seals the pass-through plate in the opening. The fold-over top flap is lined with two top rows of magnets 4070, 4071.

Figure 11:
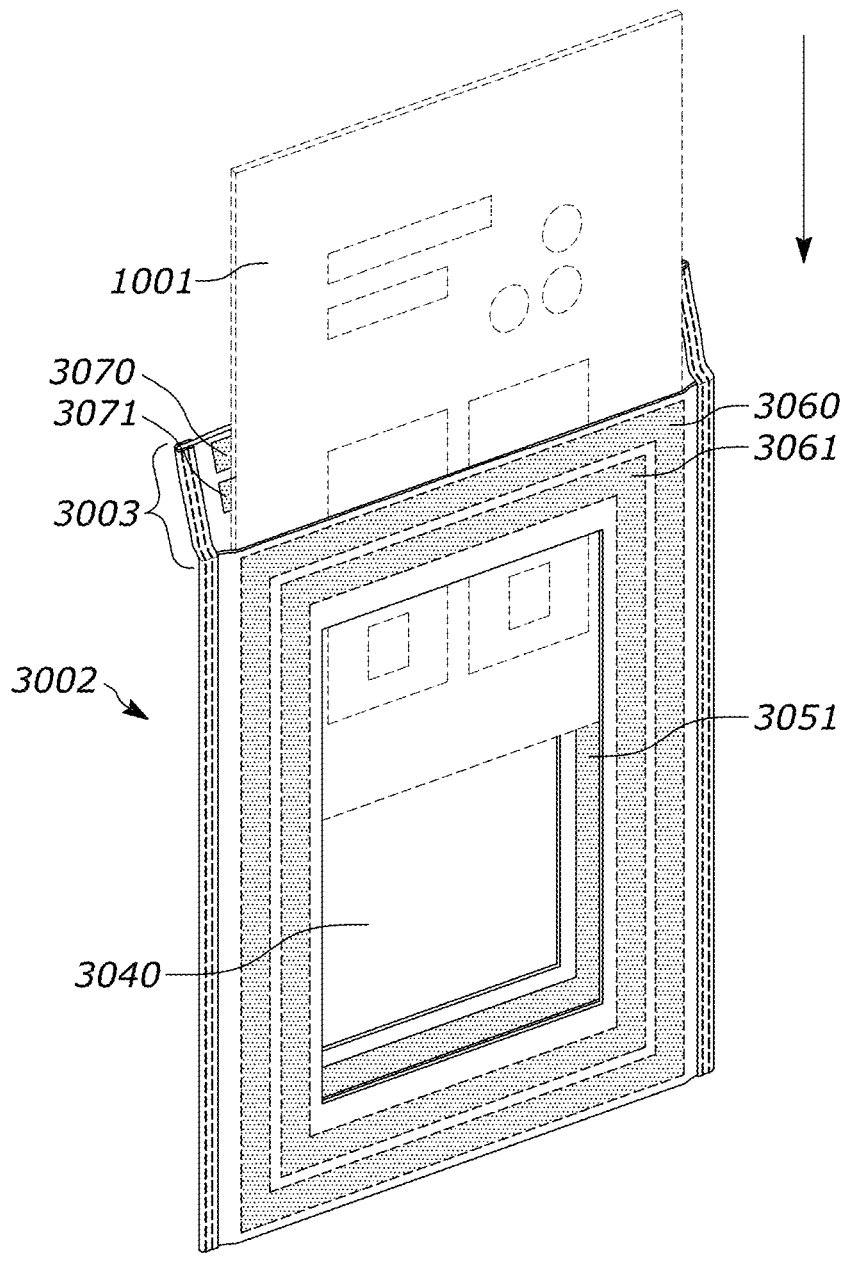
FIG. 11 illustrates a perspective view of the conductive ferrous pass-through plate of FIG. 1 partially inserted in the window pocket of FIG. 3 in an electromagnetic shielded fabric side wall according to embodiments of the present inventions.

FIG. 11 illustrates a perspective view of the conductive ferrous pass-through plate 1001 of FIG. 1 partially inserted in the window pocket 3002 of FIG. 3 in an electromagnetic shielded fabric side wall according to embodiments of the present inventions. A window pocket in an electromagnetic shielded enclosure has an electromagnetic shielded enclosure with an electromagnetic shielded fabric side wall and a floor. The opening 3040 of the electromagnetic shielded fabric side wall has electromagnetic shielded fabric lined with two inner rows 3050, 3051 of magnets around the opening. An outer perimeter of the opening 3040 in the electromagnetic shielded fabric side wall has an electromagnetic shielded fabric lined with two outer rows of magnets 3060, 3061 around the opening.

A pass-through plate 1001 is inserted in the opening 3040 between inner rows of magnets 3050, 3051 and outer rows of magnets 3060, 3061. The pass-through plate is made of a conductive ferrous material such as streel that is magnetically attracted to the inner rows of magnets and the outer rows of magnets.

A fold-over top flap 3003 at a perimeter of the opening 3040 to seal the pass-through plate in the opening 3040. The fold-over top flap is lined with two rows of magnets 3070, 3071.

Figure 12:
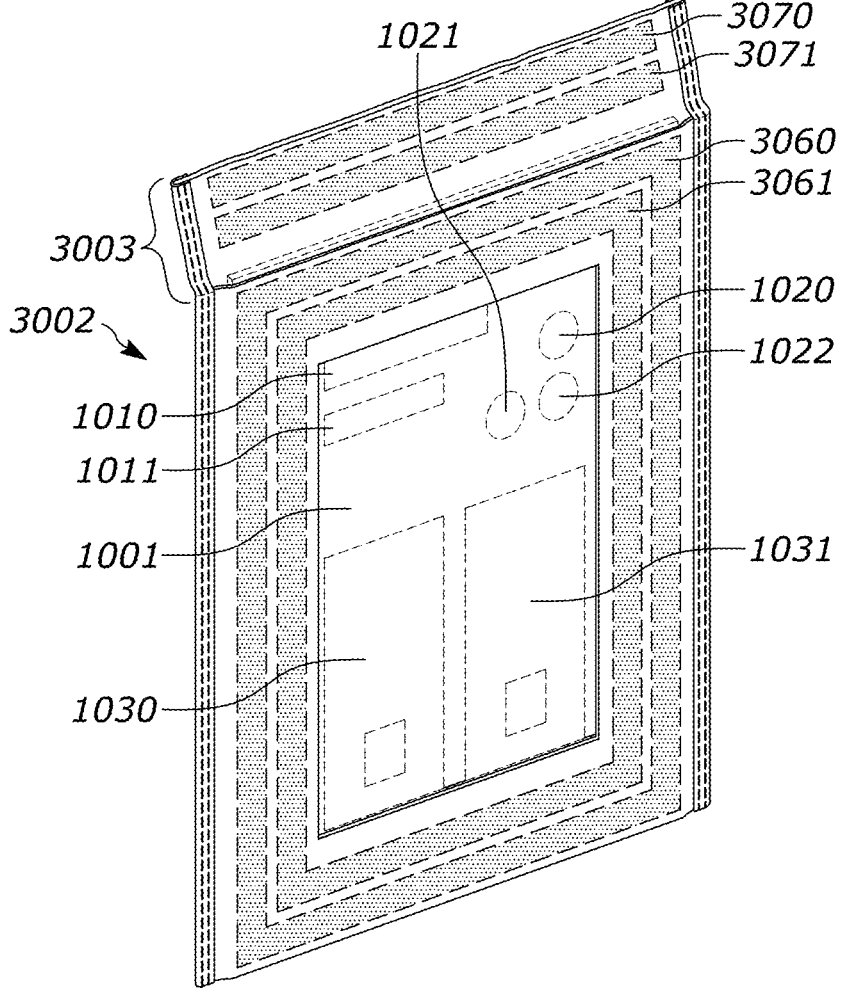
FIG. 12 illustrates a perspective view of the conductive ferrous pass-through plate of FIG. 1 fully inserted in the window pocket of FIG. 3 in an electromagnetic shielded fabric side wall with an open top flap according to embodiments of the present inventions.

FIG. 12 illustrates a perspective view of the conductive ferrous pass-through plate 1001 of FIG. 1 fully inserted in the window pocket 3002 of FIG. 3 in an electromagnetic shielded fabric side wall with an open top flap 3003 according to embodiments of the present inventions. A window pocket in an electromagnetic shielded enclosure has an electromagnetic shielded enclosure has an electromagnetic shielded fabric side wall and a floor. The opening of the electromagnetic shielded fabric side wall has an inner perimeter with an electromagnetic shielded fabric lined with two inner rows of magnets around the opening. An outer perimeter of the opening in the electromagnetic shielded fabric side wall has an electromagnetic shielded fabric lined with two outer rows of magnets 3060, 3061 around the opening.

A pass-through plate 1001 containing various sized orifices 1010, 1011, 1020, 1021, 1022, 1030, 1031 is inserted in the opening between inner rows of magnets and outer rows of magnets. The pass-through plate is made of a conductive ferrous material such as streel that is magnetically attracted to the inner rows of magnets and the outer rows of magnets.

A fold-over top flap 3003 at a perimeter of the opening to seal the pass-through plate in the opening is in an open position. The fold-over top flap is lined with two rows of magnets 3070, 3071.

Figure 13:
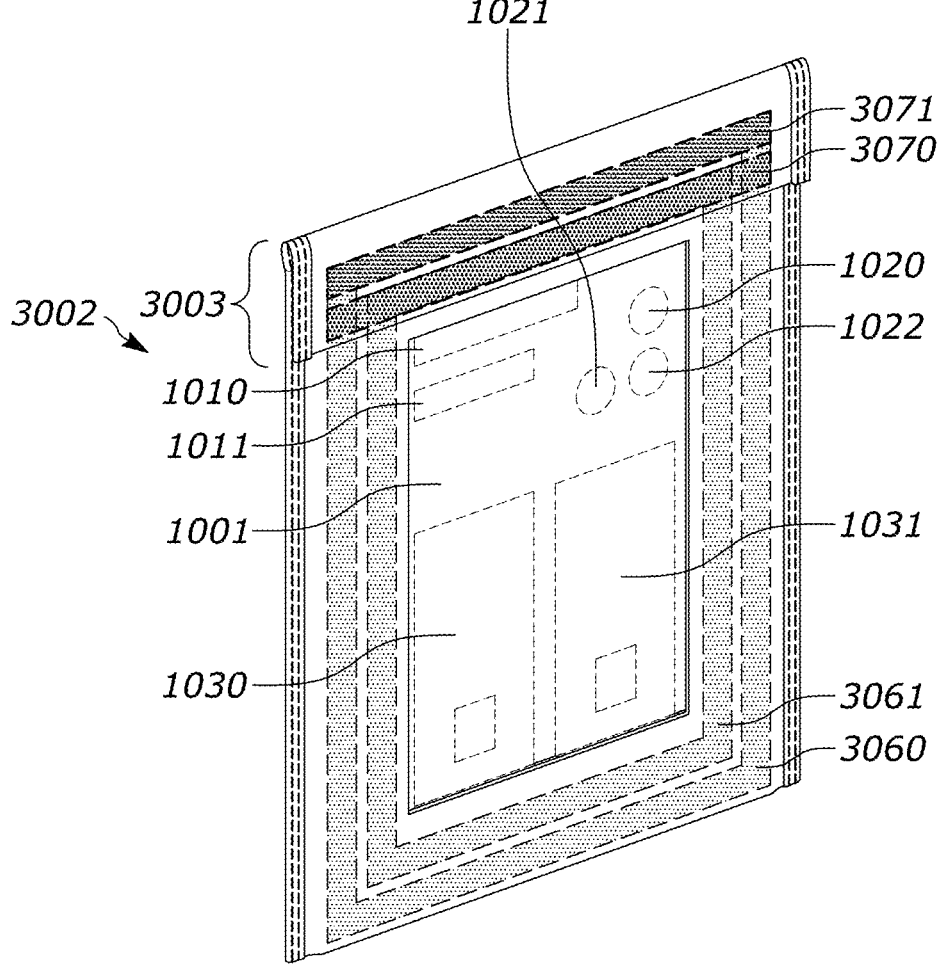
FIG. 13 illustrates a perspective view of the conductive ferrous pass-through plate of FIG. 1 fully inserted in the window pocket of FIG. 3 in an electromagnetic shielded fabric side wall with a closed top flap according to embodiments of the present inventions.

FIG. 13 illustrates a perspective view of the conductive ferrous pass-through plate 1001 of FIG. 1 fully inserted in the window pocket 3002 of FIG. 3 in an electromagnetic shielded fabric side wall with an open top flap 3003 according to embodiments of the present inventions. A window pocket in an electromagnetic shielded enclosure has an electromagnetic shielded fabric side wall and a floor. The opening of the electromagnetic shielded fabric side wall has an inner perimeter with an electromagnetic shielded fabric lined with two inner rows of magnets around the opening. An outer perimeter of the opening in the electromagnetic shielded fabric side wall has an electromagnetic shielded fabric lined with two outer rows of magnets 3060, 3061 around the opening.

A pass-through plate 1001 containing various sized orifices 1010, 1011, 1020, 1021, 1022, 1030, 1031 is inserted in the opening between inner rows of magnets and outer rows of magnets. The pass-through plate is made of a conductive ferrous material such as streel that is magnetically attracted to the inner rows of magnets and the outer rows of magnets.

A fold-over top flap 3003 at a perimeter of the opening to seal the pass-through plate in the opening is folded over in a closed position. The fold-over top flap is lined with two rows of magnets 3070, 3071.

Figure 14:
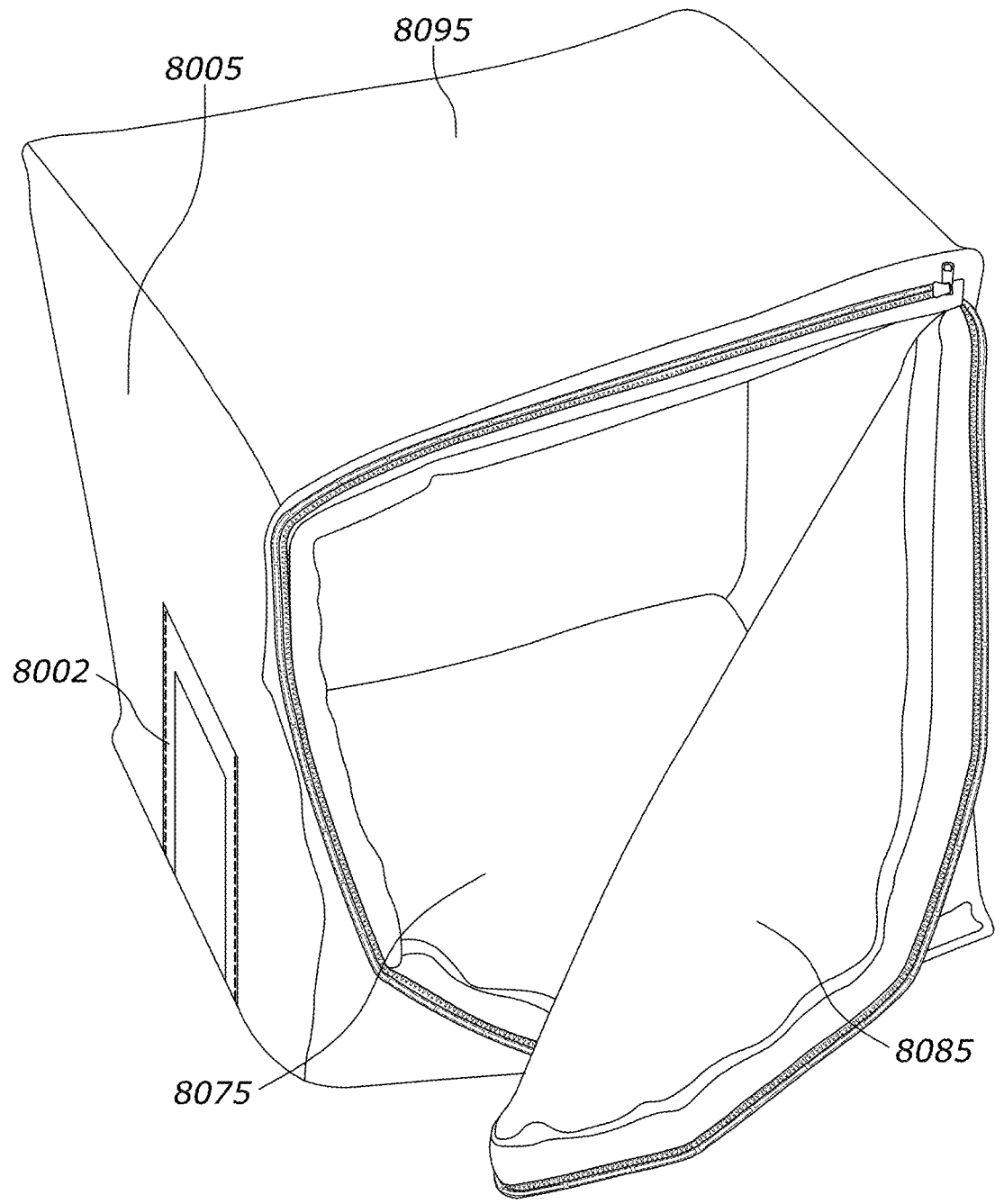
FIG. 14 illustrates a perspective view of an electromagnetic shielded enclosure having a zipper door and a window pocket according to embodiments of the present inventions.

FIG. 14 illustrates a perspective view of an electromagnetic shielded enclosure 8095 having a zipper door 8085 and a window pocket 8002 according to embodiments of the present inventions. The window pocket 8002 is sewn in an electromagnetic shielded fabric side wall 8005. The window pocket 8002 is adjacent to a floor 8075 at a bottom of the electromagnetic shielded fabric side wall 8005 of the electromagnetic shielded enclosure 8095. The floor 8075 of the electromagnetic shielded enclosure 8095 normally sits by gravity on an earth surface or table or room surface.

Any letter designations such as (a) or (b) etc. used to label steps of any of the method claims herein are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

"Reference characters corresponding to elements recited in the detailed description and the drawings may be used in conjunction with the recitation of the same element or group of elements in the claims. The reference characters, however, should be enclosed within parentheses so as to avoid confusion with other numbers or characters which may appear in the claims. The use of reference characters is to be considered as having no effect on the scope of the claims." The Manual of Patent Examining Procedure (MPEP) issued by the United States Patent and Trademark Office, chapter 608.01 (m) (Form of Claims).

Any trademarks listed herein are the property of their respective owners, and reference herein to such trademarks is generally intended to indicate the source of a particular product or service.

The abstract and the title are provided to comply with the rules requiring an abstract and a title that will allow a searcher or other reader to quickly ascertain the subject matter of the technical disclosure. It is submitted with the understanding that they will not be used to interpret or limit the scope or meaning of the claims. 37 CFR 1.72(b).

Although the inventions have been described and illustrated in the above description and drawings, it is understood that this description is by example only, and that numerous changes and modifications can be made by those skilled in the art without departing from the true spirit and scope of the inventions. Although the examples in the drawings depict only example constructions and embodiments, alternate embodiments are available given the teachings of the present patent disclosure.

What is claimed is:

1. A window pocket in an electromagnetic shielded enclosure, the window pocket comprising:

an electromagnetic shielded enclosure comprising at least one electromagnetic shielded fabric side wall and a floor; and an opening in the electromagnetic shielded fabric side wall, wherein the opening comprises an inner perimeter of the opening in the electromagnetic shielded fabric side wall comprises an electromagnetic shielded fabric lined with at least one inner row of magnets around the opening;

an outer perimeter of the opening in the electromagnetic shielded fabric side wall comprises an electromagnetic shielded fabric lined with at least one outer row of magnets around the opening; and a pass-through plate configured to fit in the opening between the inner rows of magnets and the outer rows of magnets, wherein the pass-through plate comprises a conductive ferrous material magnetically attracted to the inner rows of magnets and the outer rows of magnets.

2. A window pocket in an electromagnetic shielded enclosure according to claim 1, wherein the opening is adjacent to the floor at a bottom of the electromagnetic shielded enclosure.

3. A window pocket in an electromagnetic shielded enclosure according to claim 1, wherein at least one inner row of the at least one inner row of magnets is staggered with respect to at least one outer row of the at least one outer row of magnets.

4. A window pocket in an electromagnetic shielded enclosure according to claim 3, wherein the inner perimeter is lined with at least two inner rows of magnets around the opening.

5. A window pocket in an electromagnetic shielded enclosure according to claim 4, wherein the outer perimeter is lined with at least two outer rows of magnets around the opening.

6. A window pocket in an electromagnetic shielded enclosure according to claim 5, wherein all of the inner rows of magnets are aligned with respect to all of the outer rows of magnets.

7. A window pocket in an electromagnetic shielded enclosure according to claim 5, wherein all of the inner rows of magnets are staggered with respect to all of the outer rows of magnets.

8. A window pocket in an electromagnetic shielded enclosure according to claim 5, wherein all of the inner rows of magnets are staggered with respect to all of the outer rows of magnets.

9. A window pocket in an electromagnetic shielded enclosure according to claim 4, wherein all of the inner rows of magnets are staggered with respect to all of the outer rows of magnets.

10. A window pocket in an electromagnetic shielded enclosure according to claim 4, wherein one inner row of the at least one inner row of magnets is aligned with one outer row of the at least one outer row of magnets.

11. A window pocket in an electromagnetic shielded enclosure according to claim 1, further comprises a fold-over top flap at a perimeter of the opening to seal the pass-through plate in the opening.

12. A window pocket in an electromagnetic shielded enclosure according to claim 11, wherein the fold-over top flap is lined with at least one top row of magnets.

13. A window pocket in an electromagnetic shielded enclosure according to claim 1, wherein the pass-through plate comprises pass-through orifices.

14. A window pocket in an electromagnetic shielded enclosure according to claim 1, wherein the electromagnetic shielded enclosure comprises a zipper door.

\* \* \* \* \*